(12) United States Patent
Hu et al.

(10) Patent No.: US 7,889,875 B2
(45) Date of Patent: Feb. 15, 2011

(54) CLASS-D DRIVING METHOD FOR STEREO LOAD

(75) Inventors: Jwu-Sheng Hu, Hsin-chu (TW); Keng-Yuan Chen, Chung-Ho (TW)

(73) Assignee: National Chiao Tung University, Hsin-Chu (TW)

( * ) Notice: Subject to any disclaimer, the term of this patent is extended or adjusted under 35 U.S.C. 154(b) by 1133 days.

(21) Appl. No.: 11/594,852

(22) Filed: Nov. 9, 2006

(65) Prior Publication Data

US 2008/0111624 A1    May 15, 2008

(51) Int. Cl.
     *H03F 99/00*    (2009.01)
(52) U.S. Cl. .................................... 381/120; 330/251
(58) Field of Classification Search ............... 381/120, 381/121, 1, 2, 104, 106, 107, 56, 28, 17–22, 381/123, 300, 307, 94.1–94.5, 111, 116, 381/117; 330/251, 10, 124 R, 295, 207 A; 700/94

See application file for complete search history.

(56) References Cited

U.S. PATENT DOCUMENTS

| | | | | |
|---|---|---|---|---|
| 4,689,819 A | * | 8/1987 | Killion | ................ 381/321 |
| 5,317,640 A | * | 5/1994 | Callias | ................ 381/321 |
| 6,016,075 A | | 1/2000 | Hamo | |
| 6,731,162 B2 | * | 5/2004 | Yeongha et al. | ............... 330/10 |
| 6,924,700 B2 | | 8/2005 | Taura et al. | |
| 7,078,964 B2 | | 7/2006 | Risbo et al. | |
| 7,492,217 B2 | * | 2/2009 | Hansen et al. | ............... 330/10 |
| 2008/0278230 A1 | * | 11/2008 | Kost et al. | ................ 330/10 |

\* cited by examiner

*Primary Examiner*—Vivian Chin
*Assistant Examiner*—Lun-See Lao
(74) *Attorney, Agent, or Firm*—Birch, Stewart, Kolasch & Birch, LLP

(57) ABSTRACT

The present invention provides a class D amplifier and method for driving a tri-wired stereo amplifier. Additionally, the class D amplifier includes a first filter, a second filter, a processor, a 2D-quantitizer, a signal generator, and a logic circuit. The class D amplifier and method of the invention can reduce cost of production and increase processing efficiency. More particularly, the class D amplifier and method of the invention are processed in an optimal feedback mode, so as to reduce the reciprocal effect between the two channels, and avoid mismatch of the two amplifiers.

14 Claims, 6 Drawing Sheets

CLASS-D DRIVING METHOD FOR STEREO LOAD

FIELD OF THE INVENTION

The present invention relates to a Class D amplifier and its method, more specifically, it relates to a Class D amplifier based on a three-phase full-bridge structure and its method of driving Tri-wired stereo amplifier.

BACKGROUND OF THE INVENTION

Audio amplifier has wide-spread application in all electronic products that need audio output, for example, walkman, audio set, MP3 player, PDA and cellular phone, etc. The conventional Audio amplifier can be categorized as A type, B type, AB type and D type, etc. Among them, A type, B type and AB type amplifier are the so-called linear amplifier and class D amplifier is nonlinear amplifier called pulse width modulation (PWM) amplifier.

A type amplifier usually just has one active component, for example, transistor. The transistor needs a bias circuit, therefore, no matter how large the input signal is, it can not be in fully conducted or fully non-conducted state and this conducted/non-conducted region is the so-called linear region. A type amplifier has the advantage of high linearity in its response and thus low loss of fidelity in its output, which makes it suitable for high fidelity audio system. However, A type amplifier has very low efficiency with a theoretical power efficiency of about 25% but an actual power efficiency of only about 15% to 20%. Additionally, A type amplifier will generate large amount of heat during the use at large power, it is thus not suitable to be used as portable equipment.

B type amplifier is generally composed of two transistors pushing each other, one outputs the current and the other absorbs the current and the effect of amplification is achieved through alternate conduction of these two transistors. B type amplifier has larger power efficiency than that of A type amplifier, that is, it has a theoretical power efficiency of about 78% and the real power efficiency is in between 50% to 70%. However, when the input signal is smaller than the conduction voltage of the transistor, both transistors will be at non-conducted states, this is the so-called intermodulation distortion. Therefore, B type amplifier is not linear in the whole dynamic range.

Additionally, AB type amplifier is a combination of A type and B type amplifier. Its structure is very similar to B type amplifier but a circuit which can provide small bias current to each transistor is adopted; therefore, each transistor will not be in fully non-conducted state. Its power consumption is larger but the intermodulation distortion can be almost eliminated. Its operation is similar to B type amplifier and two transistors are associated to complete the mission, however, the overall performance is a little bit better than that of B type amplifier. The theoretical power efficiency of AB type amplifier is about 78% but the actual value is in between 50% to 70%.

The common disadvantages of the above mentioned A type, B type and AB type amplifier are the needs of good heat-dissipating equipment and space. Therefore, they are mostly bulky and the operation consumes a lot of power. Under the trend of low power consumption, small form factor and light weight pursued by most electronic products, those linear amplifiers thus are not suitable to be used in such electronic products.

Therefore, CLASS D AMPLIFIER is thus developed with an efficiency higher than the above mentioned linear amplifier (class D amplifier has a theoretical power efficiency of about 100% but the actual power efficiency is still higher than 85%) to meet the above mentioned needs. Class D amplifier can save more power and improve the lifetime of battery due to its high power efficiency. Moreover, class D amplifier generates lower heat during its operation and thus can reduce the energy control cost. What's even more is some class D amplifiers do not need heat-dissipating devices and thus the volume of equipment which adopts that kind of amplifier can be much smaller.

Currently, lots of literature discloses several improved class D amplifiers in an attempt to further increase the power efficiency and enhance the stability of class D amplifier; moreover, its circuit is further simplified and its volume is even smaller and the fidelity loss is even fewer. For example, U.S. Pat. No. 4,689,819 discloses how to make the CMOS device of class D amplifier more efficient under smaller volume and compatible battery set; U.S. Pat. No. 5,317,640 discloses how class D amplifier can reduce the current and reduce in turn the power consumption when the input signal is zero, this makes it suitable to be used in the driving of mono channel or hearing aids; U.S. Pat. No. 6,016,075 discloses a class D amplifier which can reduce cost and DC component error; U.S. Pat. No. 6,924,700 discloses a class D amplifier with correction circuit; U.S. Pat. No. 7,078,964 discloses class D amplifier having DC current detection circuit.

However, in the prior art, when class D amplifier is used to drive dual channel tri-wired stereo amplifier, half-bridge circuit architecture needs to be used to realize this idea; since this method needs the supply of bipolar power for its operation, it is thus not suitable to be used in portable products. If it is to be used in portable product and uni-polar power, such as battery, is used as the power supply, then a generator circuit of half voltage point is needed to drive the amplifier; since the half voltage point generator circuit is analog circuit, temperature drift, input voltage drift and process drift must be considered during the designing stage, the output voltage is thus easily changed by different working environments, which might further lead to power consumption due to the need of extra circuit and might affect the audio output quality of the entire system.

SUMMARY OF THE INVENTION

Therefore, one of the application scope of the current invention is to provide a class D amplifier and a method for driving a tri-wired stereo amplifier. According to the class D amplifier of the present invention and its driving method, it can eliminate the use of prior art half-bridge circuit architecture and thus reduce the production cost and enhance the efficiency. More specifically, class D amplifier of the present invention and its driving method is performed under optimal feedback method which can reduce the mutual influence of two audio channels and avoid the mismatches between two speakers.

A preferred embodiment of the present invention of class D amplifier is used to drive a tri-wired stereo amplifier. The class D amplifier contains a first filter, a second filter, a processor, a two dimensional quantitizer, a signal generator and a logic circuit.

Furthermore, the first filter receives a first left audio channel sound signal and a first right audio channel sound signal from a sound generator unit; moreover, with the use of a over-sampling frequency, the first left audio channel sound signal is processed to a second left audio channel sound signal and the first right audio channel sound signal is processed to a second right audio channel sound signal.

The second filter is coupled to the first filter and the two dimensional quantitizer so as to receive the second left audio channel sound signal and the second right audio channel sound signal from the first filter and to receive a first left audio channel triggering signal and a first right audio channel triggering signal from the two dimensional quantitizer. Moreover, the second filter re-configures the second audio channel sound signal and the first triggering signal according to a frequency weighted average function so as to generate a left audio channel error signal corresponded to the second left audio channel sound signal and the first left audio channel triggering signal; and, moreover, a right audio channel error signal corresponded to the second right audio channel sound signal and the first right audio channel triggering signal.

Moreover, the processor is coupled to the second filter so as to receive the left audio channel error signal and the right audio channel error signal. And the error signal is used to calculate a left audio channel optimal signal corresponded to the left audio channel error signal and a right audio channel optimal signal corresponded to the right audio channel error signal.

The two dimensional quantitizer is coupled to the processor in order to receive the left audio channel optimal signal and the right audio channel optimal signal, and to convert those optimal signals into a second left audio channel triggering signal corresponded to the left audio channel optimal signal and a second right audio channel triggering signal corresponded to the right audio channel optimal signal. Furthermore, the two dimensional quantitizer sends the second left audio channel triggering signal and the second right audio channel triggering signal to the second filter to replace respectively the first left audio channel triggering signal and the first right audio channel triggering signal.

Moreover, the signal generator is coupled to the two dimensional quantitizer in order to receive the second left audio channel triggering signal and the second right audio channel triggering signal; in the mean time, multiple driving signals are generated according to the second triggering signal.

The logic circuit contains multiple switches wherein each switch corresponds to each of the multiple driving signals. Furthermore, the logic circuit is coupled to the signal generator in order to receive the multiple driving signals and the multiple driving signals are used to control the corresponding switch in the logic circuit and to further drive the tri-wired stereo amplifier.

A method for driving a tri-wired stereo amplifier according to a preferred embodiment of the present invention comprising the following steps:

(a) Receiving a first left audio channel sound signal and a first right audio channel sound signal.

(b) Associating an over-sampling frequency to process the first left audio channel sound signal to a second left audio channel sound signal; and furthermore, processing the first right audio channel sound signal to a second right audio channel sound signal.

(c) Re-configuring the second audio channel sound signal, a first left audio channel triggering signal and a first right audio channel triggering signal according to a frequency weighted average function in order to generate a left audio channel error signal corresponded to the second left audio channel sound signal and the first left audio channel triggering signal and to generate a right audio channel error channel corresponded to the second right audio channel sound signal and the first right audio channel triggering signal.

(d) Calculating a left audio channel optimal signal corresponded to the left audio channel error signal and a right audio channel optimal signal corresponded to the right audio channel error signal.

(e) Converting those optimal signals into a second left audio channel triggering signal corresponded to the left audio channel optimal signal and a second right audio channel triggering signal corresponded to the right audio channel optimal signal.

(f) Using respectively the second left audio channel triggering signal and the second right audio channel triggering signal to replace the first left audio channel triggering signal and the first right audio channel triggering signal.

(g) Generating multiple driving signals according to those second triggering signals.

(h) Using those multiple driving signals to control the corresponding multiple switches in a logic circuit so as to drive the tri-wired stereo amplifier.

The advantages and spirit of the present invention can be further understood through the following detailed descriptions and the figures attached.

DETAILED DESCRIPTION OF THE PREFERRED EMBODIMENTS

The present invention provides a class D amplifier for driving a tri-wired stereo amplifier and its driving method. In the followings, some embodiments and real application cases of the present invention will be described in details in order to fully explain the features, spirit and advantages of the present invention.

Figure 1:
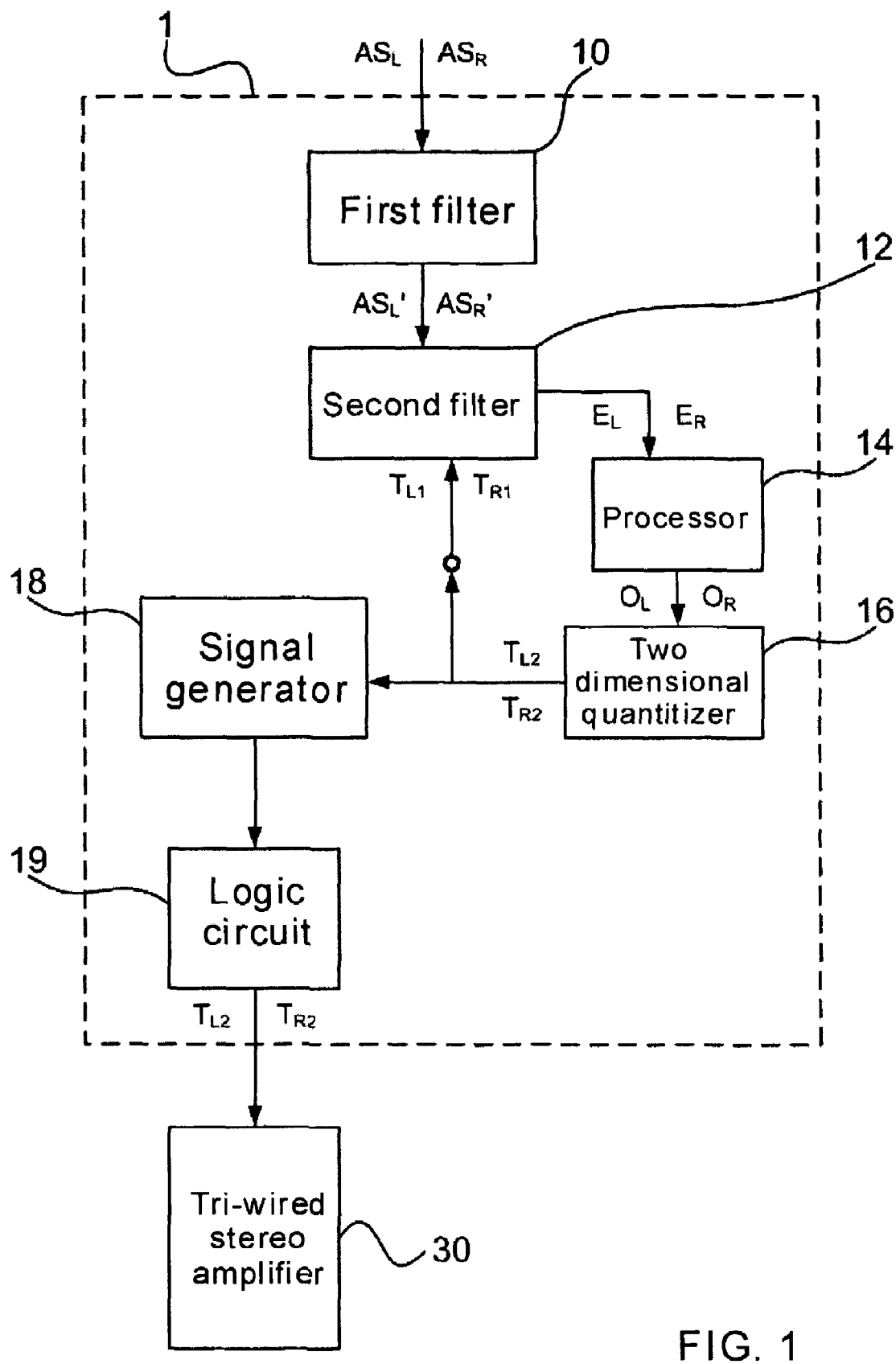
FIG. 1 illustrates the functional block diagram of a class D amplifier of a preferred embodiment of the present invention.

Please refer to FIG. 1 which shows the functional block diagram of one embodiment class D amplifier of the present invention. As shown in FIG. 1, the class D amplifier 1 contains a first filter 10, a second filter 12, a processor 14, a two dimensional quantitizer 16, a signal generator 18 and a logic circuit 19. Moreover, the class D amplifier 1 can be used to drive a tri-wired stereo amplifier 30.

The first filter 10 receives a first left audio channel sound signal ($AS_L$) and a first right audio channel sound signal ($AS_R$) from a sound generator unit (not drawn in the figure). Meanwhile, the first filter 10, associated with an over-sampling frequency, can process the first left audio channel sound signal ($AS_L$) to a second left audio channel sound signal ($AS_L'$) and process the first right audio channel sound signal ($AS_R$) to a second right audio channel sound signal ($AS_R'$).

The second filter 12 is coupled to the first filter 10 and the two dimensional quantitizer 16 so as to receive the second left audio channel sound signal ($AS_L'$) and the second right audio channel sound signal ($AS_R'$) from the first filter 10 and to receive a first left audio channel triggering signal ($T_{L1}$) and a first right audio channel triggering signal ($T_{R1}$) from the two dimensional quantitizer 16. Furthermore, second filter 12 re-configure those second audio channel sound signals ($AS_L'$, $AS_R'$) and those first triggering signals ($T_{L1}$, $T_{R1}$) according to a frequency weighting function so as to generate a left audio channel error signal ($E_L$) corresponded to the second left audio channel sound signal ($AS_L'$) and the first left audio channel triggering signal ($T_{L1}$) and a right audio channel error signal ($E_R$) corresponded to the second right audio channel sound signal ($AS_R'$) and the first right audio channel triggering signal ($T_{R1}$).

In the real application, the frequency weighting function matches the following [Equation 1]:

$$\begin{cases} \begin{bmatrix} X_R(k+1) \\ X_L(k+1) \end{bmatrix} = A \begin{bmatrix} X_R(k) \\ X_L(k) \end{bmatrix} + B \begin{bmatrix} AS_R'(k) - T_{R1}(k) \\ AS_L'(k) - T_{L1}(k) \end{bmatrix} \\ \begin{bmatrix} E_R(k) \\ E_L(k) \end{bmatrix} = C \begin{bmatrix} X_R(k) \\ X_L(k) \end{bmatrix} + D \begin{bmatrix} AS_R'(k) - T_{R1}(k) \\ AS_L'(k) - T_{L1}(k) \end{bmatrix} \end{cases} \quad [\text{Equation 1}]$$

wherein, $$\begin{bmatrix} X_R \\ X_L \end{bmatrix} \in R^{n \times 1}$$

is the status of class D amplifier; $A \in R^{n \times n}$; $B \in R^{n \times 2}$; $C \in R^{2 \times n}$; and $D \in R^{2 \times 2}$.

Furthermore, the processor 14 is coupled to the second filter 12 so as to receive the left audio channel error signal ($E_L$) and the right audio channel error signal ($E_R$). The processor 14 further calculates a left audio channel optimal signal (Optimized signal) ($O_L$) corresponded to the left audio channel error signal ($E_L$) and a right audio channel optimal signal ($O_R$) corresponded to the right audio channel error signal ($E_R$).

In the real application, those optimal signals ($O_L$, $O_R$) can minimize the values in the following [Equation 2]:

$$V = E(k) P E(k)^T \quad [\text{Equation 2}]$$

wherein, P is a 2×2 weighting matrix having a form of $$\begin{bmatrix} 1 & p_1 \\ p_1 & 1 \end{bmatrix}$$

with $p_1 < 1$; T is the period of over-sampling frequency.

Furthermore, the two dimensional quantitizer 16 is coupled to the processor 14 in order to receive left audio channel optimal signal ($O_L$) and the right audio channel optimal signal ($O_R$). Moreover, those optimal signals ($O_L$, $O_R$) are converted into a second left audio channel triggering signal ($T_{L2}$) corresponded to the left audio channel optimal signal ($O_L$) and a second right audio channel triggering signal ($T_{R2}$) corresponded to the right audio channel optimal signal ($O_R$).

Please notice that, in the current invention, the two dimensional quantitizer 16 can transfer the second left audio channel triggering signal ($T_{L2}$) and the second right audio channel triggering signal ($T_{R2}$) to the second filter 12 so as to replace respectively the first left audio channel triggering signal ($T_{L1}$) and the first right audio channel triggering signal ($T_{L1}$) to form a feedback circuit.

The signal generator 18 is couple to the two dimensional quantitizer 16 in order to receive the second left audio channel triggering signal ($T_{L2}$) and the second right audio channel triggering signal ($T_{R2}$) and generate multiple driving signals according to those second triggering signal ($T_{L2}$, $T_{R2}$).

Finally, the logic circuit 19 contains multiple switches (not drawn in the figure) and each switch corresponds to one of the multiple driving signals. Furthermore, the logic circuit 19 is coupled to the signal generator 18 so as to receive the multiple driving signals and control the corresponding switch of the logic circuit 19 according to the multiple driving signals and further drive the tri-wired stereo amplifier 30.

Figure 2:
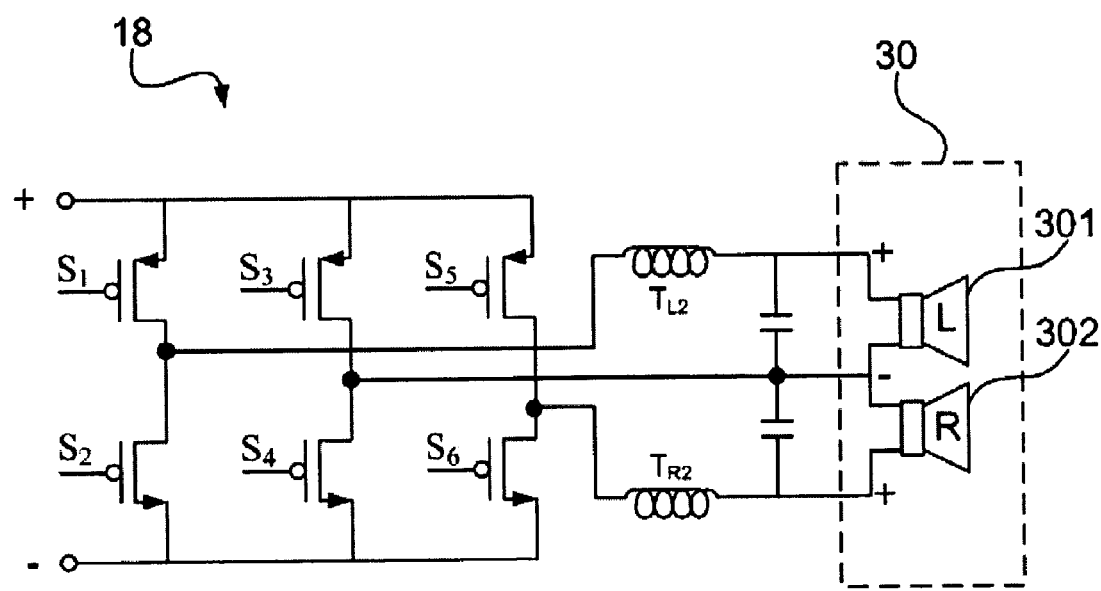
FIG. 2 illustrates a logic circuit of an embodiment of the present invention.

Please further refer to FIG. 2 which shows an embodiment of the present invention, that is, a logic circuit. As shown in FIG. 2, the logic circuit 18 is a three phase full bridge circuit and contains six switches ($S_1$, $S_2$, $S_3$, $S_4$, $S_5$ and $S_6$). In other words, in the current embodiment, the signal generator of the present invention (not drawn in the figure) will generate six driving signals to control those six switches. Through the control on the six switches of the logic circuit 18, the second left audio channel triggering signal ($T_{L2}$) and the second right audio channel triggering signal ($T_{R2}$) processed by class D amplifier can be transferred respectively to the left side speaker 301 and the right side speaker 302 of the tri-wired stereo amplifier 30 to output the sound.

Please notice that, since the logic circuit 18 contains 6 switches, it thus contains $2^6 = 64$ kinds of switching states and only 19 states can transfer those triggering signals to the speaker. Please see the following table 1 for those 19 states.

TABLE 1

| No. | Left speaker | Right speaker | $S_1$ | $S_2$ | $S_3$ | $S_4$ | $S_5$ | $S_6$ |
|---|---|---|---|---|---|---|---|---|
| 1 | P | 0 | On | Off | Off | On | Off | Off |
| 2 | P | 0L | On | Off | Off | On | Off | On |
| 3 | 0 | P | Off | Off | Off | On | On | Off |
| 4 | 0L | P | Off | On | Off | On | On | Off |
| 5 | N | 0 | Off | On | On | Off | Off | Off |
| 6 | N | 0H | Off | On | On | Off | On | Off |
| 7 | 0 | N | Off | Off | On | Off | Off | On |
| 8 | 0H | N | On | Off | On | Off | Off | On |
| 9 | 0H | 0H | On | Off | On | Off | On | Off |
| 10 | 0H | 0 | On | Off | On | Off | Off | Off |
| 11 | 0 | 0H | Off | Off | On | Off | On | Off |
| 12 | 0L | 0L | Off | On | Off | On | Off | On |
| 13 | 0L | 0 | Off | On | Off | On | Off | Off |
| 14 | 0 | 0L | Off | Off | Off | On | Off | On |
| 15 | 0 | 0 | Off | Off | Off | Off | Off | Off |
| 16 | P/2 | N/2 | On | Off | Off | Off | Off | On |
| 17 | N/2 | P/2 | Off | On | Off | Off | On | Off |
| 18 | 0H/2 | 0H/2 | On | Off | Off | Off | On | Off |
| 19 | 0L/2 | 0L/2 | Off | On | Off | Off | Off | On |

P: positive direction current;
N: negative direction current;
0: Floating connections on two ends of the speaker;
0L: Two ends of the speaker and the lower arm of full bridge are connected into a loop;
0H: Two ends of the speaker and the upper arm of full bridge are connected into a loop;
P/2: Positive direction current with current value reduced to half;
N/2: Negative direction current with current value reduced to half.

Take an example, we know from table 1 that, the states of number 1, 2, 5 and 6 are to let right audio channel to stay inactive but only drive the left audio channel. The states of number 16 and 17 drive in the same time two audio channels with reverse current. More specifically, in the present embodiment, since the full bridge circuit which drives two audio channels co-use $S_3$ and $S_4$ switches, the switching states of two audio channels are not in independent operation to each other.

Furthermore, in one embodiment, the second left audio channel triggering signal ($T_{L2}$) and the second right audio channel triggering signal ($T_{R2}$) are limited to five values of 0, 1, −1, ½ and −½. Moreover, the signal generator can generate driving signals for driving the above mentioned logic circuit according to those triggering signals. Please refer to table 2 which lists the values of those triggering signals to be corresponded to the states in table 1.

TABLE 2

| $T_L$ | $T_R$ | Status No. of Table 1 |
|---|---|---|
| 1 | 0 | 1, 2 |
| 0 | 1 | 3, 4 |
| −1 | 0 | 5, 6 |
| 0 | −1 | 7, 8 |
| 0 | 0 | 9~15, 18, 19 |
| ½ | −½ | 16 |
| −½ | ½ | 17 |

Yet in another embodiment, the second left audio channel triggering signal ($T_{L2}$) and the second right audio channel triggering signal ($T_{R2}$) can be further limited to three values of 0, 1 and −1.

Figure 3A:
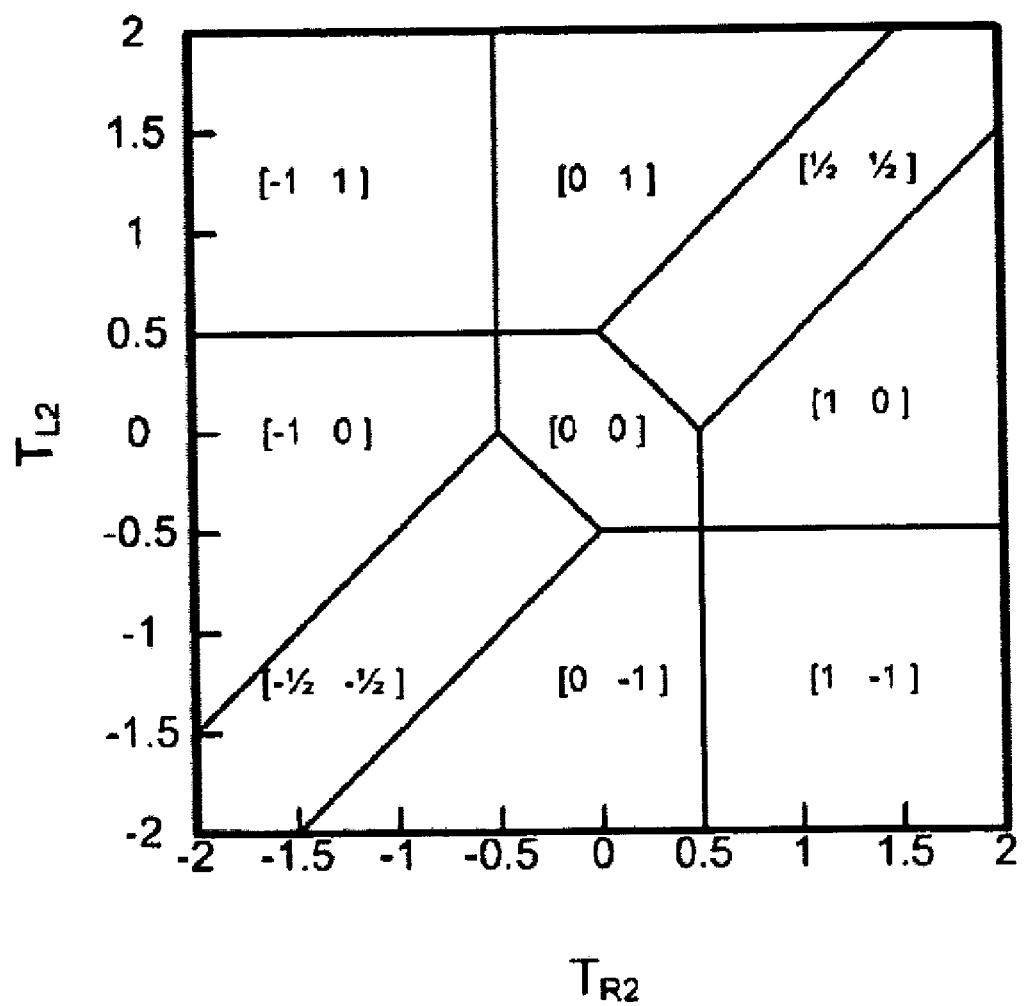
FIG. 3A illustrates the output input relationship chart of two dimensional quantitizer generated when those second triggering signals of the present invention are limited to five values of 0, 1, −1, ½, −½.
Figure 3B:
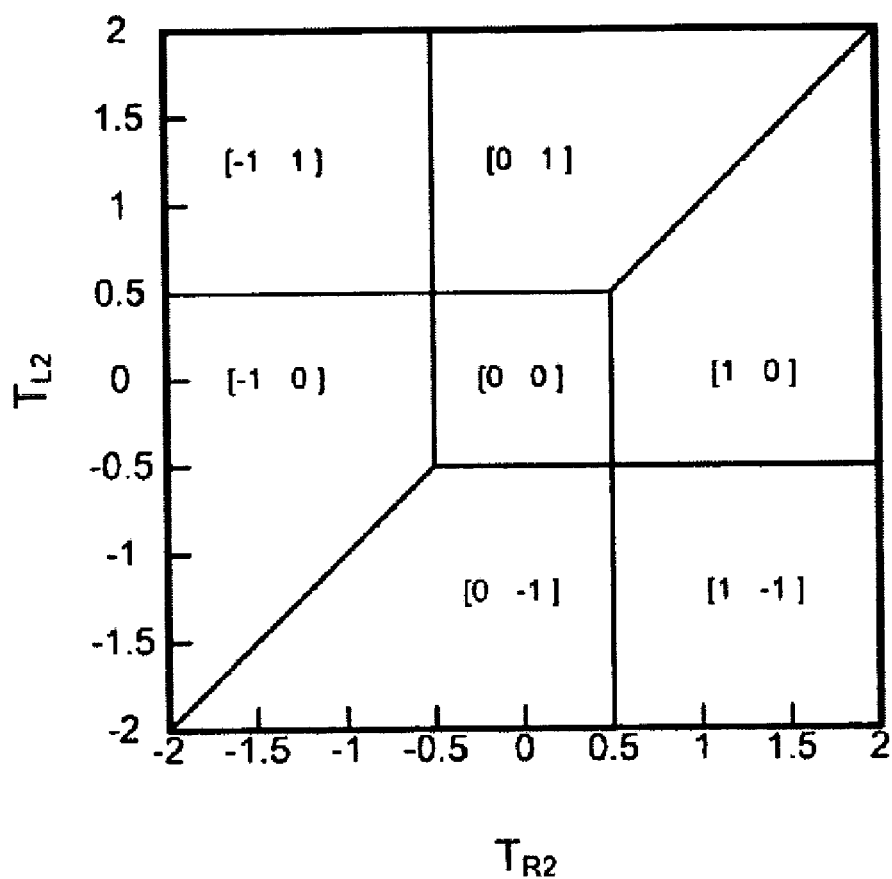
FIG. 3B illustrates the output input relationship chart of two dimensional quantitizer generated when those second triggering signals of the present invention are limited to three values of 0, 1 and −1.

Please further refer to FIG. 3A and FIG. 3B, FIG. 3A illustrates an output and input relationship chart of two dimensional quantitizer generated when those above mentioned second triggering signals ($T_{L2}$, $T_{R2}$) are limited to a set A={0, 1, −1, ½, −½}; FIG. 3B illustrates an output and input relationship chart of two dimensional quantitizer generated when those above mentioned second triggering signals ($T_{L2}$, $T_{R2}$) are limited to a set B={0, 1, −1}.

Figure 4:
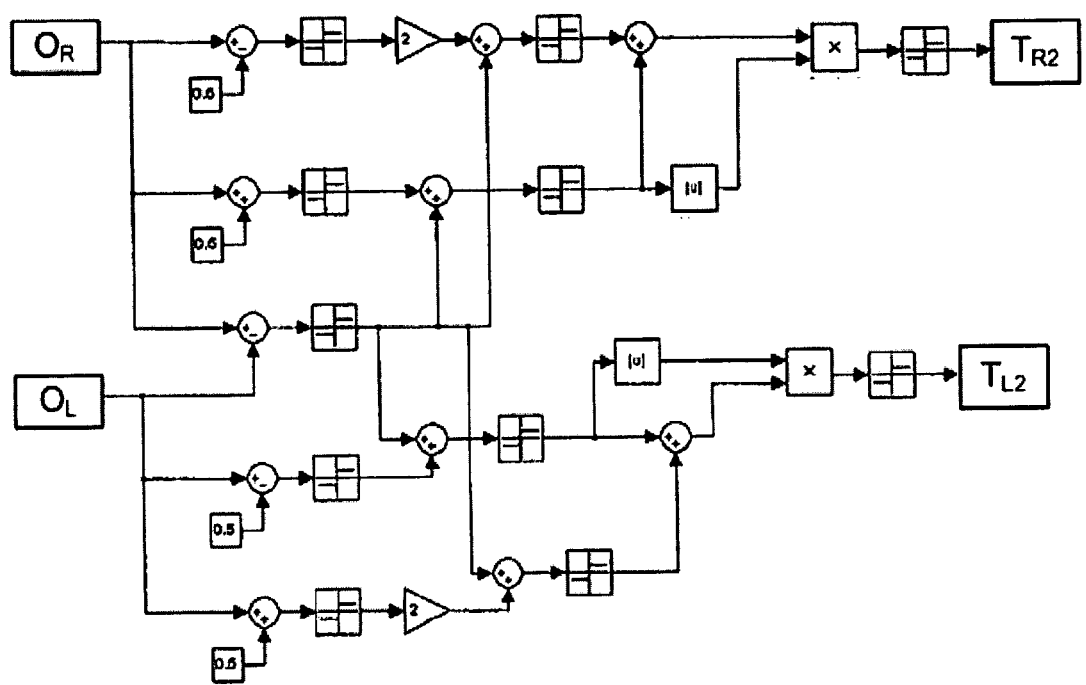
FIG. 4 illustrates the electronic circuit block diagram of two dimensional quantitizer of one embodiment of the present invention and we can see that it can realize the triggering signal set of FIG. 3B.

Please refer to FIG. 4 which illustrate a circuit block diagram of two dimensional quantitizer of an embodiment of the current invention; we see that it can realize the triggering signal set of FIG. 3B. Please notice that, the circuit layout of the present invention which can realize the above mentioned triggering signal is not limited to any specific circuit layout, it can be other layout which is decided by the real situation.

Figure 5:
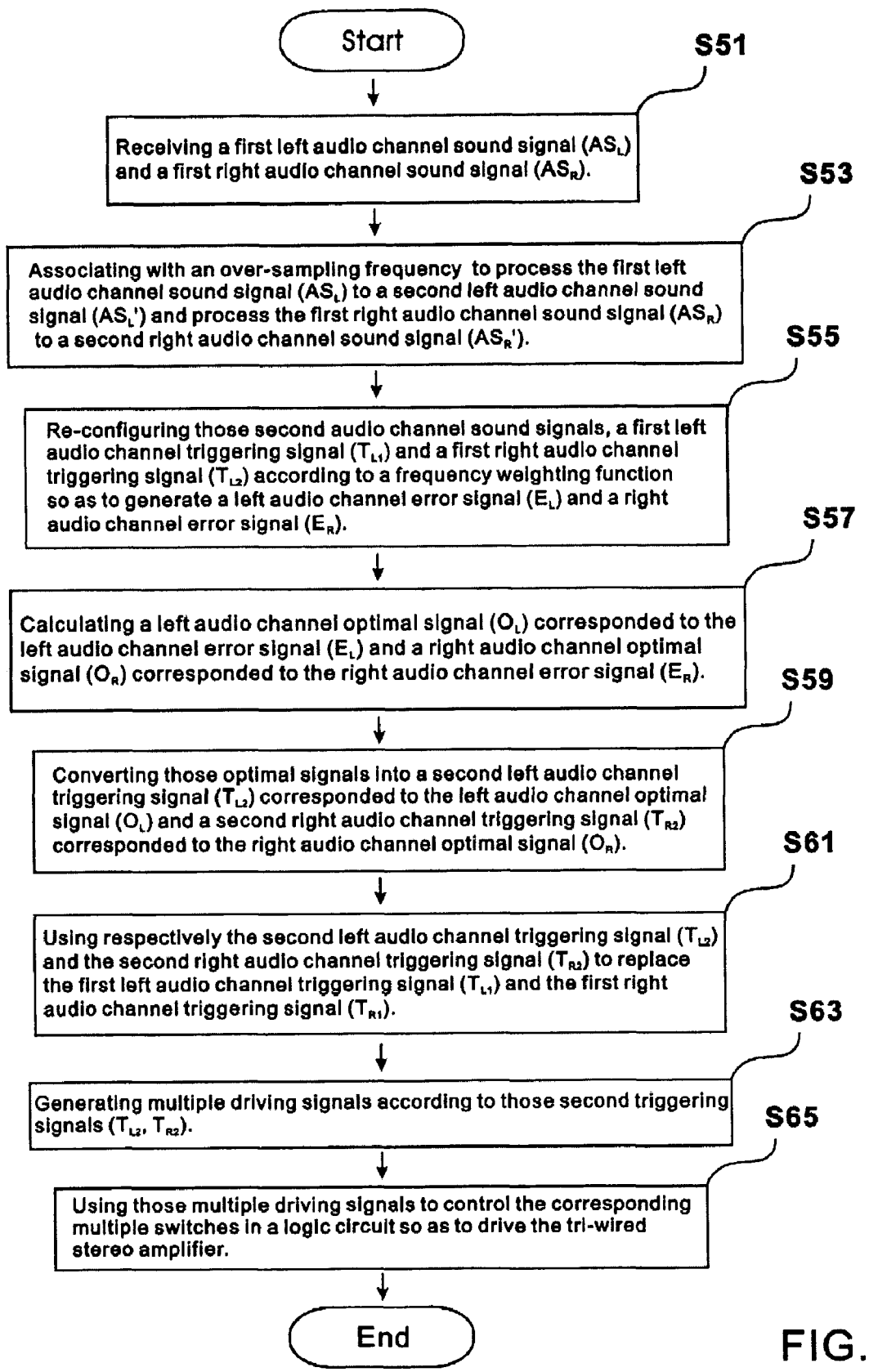
FIG. 5 illustrates the block diagram of a method for driving tri-wired stereo amplifier for a preferred embodiment of the present invention.

Please refer to FIG. 5 which illustrates a block diagram of a method for driving a tri-wired stereo amplifier according to an embodiment of the present invention. As shown in FIG. 5, the method includes the following steps:

S51, receiving a first left audio channel sound signal ($AS_L$) and a first right audio channel sound signal ($AS_R$).

S53, associating with an over-sampling frequency to process the first left audio channel sound signal ($AS_L$) to a second left audio channel sound signal ($AS_L'$) and process the first right audio channel sound signal ($AS_R$) to a second right audio channel sound signal ($AS_R'$).

S55, re-configuring those second audio channel sound signals ($AS_L'$, $AS_R'$), a first left audio channel triggering signal ($T_{L1}$) and a first right audio channel triggering signal ($T_{L2}$) according to a frequency weighting function so as to generate a left audio channel error signal ($E_L$) corresponded to the second left audio channel sound signal ($AS_L'$) and the first left audio channel triggering signal ($T_{L1}$) and a right audio channel error signal ($E_R$) corresponded to the second right audio channel sound signal ($AS_R'$) and the first right audio channel triggering signal ($T_{R1}$).

S57, calculating a left audio channel optimal signal ($O_L$) corresponded to the left audio channel error signal ($E_L$) and a right audio channel optimal signal ($O_R$) corresponded to the right audio channel error signal ($E_R$).

S59, converting those optimal signals ($O_L$, $O_R$) into a second left audio channel triggering signal ($T_{L2}$) corresponded to the left audio channel optimal signal ($O_L$) and a second right audio channel triggering signal ($T_{R2}$) corresponded to the right audio channel optimal signal ($O_R$).

S61, using respectively the second left audio channel triggering signal ($T_{L2}$) and the second right audio channel triggering signal ($T_{R2}$) to replace the first left audio channel triggering signal ($T_{L1}$) and the first right audio channel triggering signal ($T_{R1}$).

S63, generating multiple driving signals according to those second triggering signals ($T_{L2}$, $T_{R2}$).

S65, using those multiple driving signals to control the corresponding multiple switches in a logic circuit so as to drive the tri-wired stereo amplifier.

In one embodiment, the logic circuit is a three phase full bridge circuit. Furthermore, in real application, the three phase full bridge circuit contains six switches and the signal generator generates six driving signals to control respectively the six switches.

Yet, in another embodiment, the second left audio channel triggering signal ($T_{L2}$) and the second right audio channel triggering signal ($T_{R2}$) are limited to five values of 0, 1, −1, ½ and −½. Further in another embodiment, the second left audio channel triggering signal ($T_{L2}$) and the second right audio channel triggering signal ($T_{R2}$) are limited to three values of 0, 1 and −1.

Furthermore, in real application, the frequency weighting function in the method of the current invention matches the above mentioned [Equation 1]. Further in real application, those optimal signals ($O_L$, $O_R$) can make the value of the above mentioned [Equation 2] the smallest.

Obviously, class D amplifier of the present invention can be realized through the above mentioned method in order to drive the tri-wired stereo amplifier. As compared to the prior art, the class D amplifier of the present invention and its method can remove the need of using central voltage generator circuit in the half bridge power amplifier and achieve the purpose of efficiency enhancement and cost saving. More specifically, since the driving signal of the present invention is generated through optimal feedback method of limiting conditions, the mutual influence of two audio channels can thus be reduced and the mismatch between two speakers can be further reduced.

Although the present invention has been disclosed as above through a preferred embodiment and the figures, it is indeed to describe but not limit the scope of the present invention. Any one who is familiar with the prior art can make any kinds of equivalent change and modification without deviating from the spirit and scope of the present invention. Therefore, the scope of the present invention should be defined by what is claimed.

What is claimed is:

1. A class D amplifier for driving tri-wired stereo amplifier, the class D amplifier comprising of: a first filter, receives a first left audio channel sound signal and a first right audio channel sound signal from a sound generator unit, and associates with an over-sampling frequency to process the first left audio channel sound signal to a second left audio channel sound signal and process the first right audio channel sound signal to a second right audio channel sound signal; a second filter, coupled to the first filter and a two dimensional quantitizer, is used to receive the second left audio channel sound signal and the second right audio channel sound signal from the first filter and to receive a first left audio channel triggering signal and a first right audio channel triggering signal from the two dimensional quantizer, a frequency weighting function is used to re-configure the second audio channel sound signals and those first triggering signals so as to generate a left audio channel error signal corresponded to the second left audio channel sound signal and the first left audio channel triggering signal and a right audio channel corresponded to the second right audio channel sound signal and the first right audio channel triggering signal; a processor, coupled to the second filter, is used to receive the left audio channel error signal and the right audio channel error signal the error signals are used to calculate a left audio channel optimal signal corresponded to the left audio error signal and a right audio channel optimal signal corresponded to the right audio channel error signal; the two dimensional quantizer, is coupled to the processor, is used to receive the left audio channel optimal signal and the right audio channel optimal signal; and convert the optimal signals into a second left audio channel triggering signal corresponded to the left audio channel optimal signal and a second right audio channel triggering signal corresponded to the right audio channel optimal signal; the two dimensional quantizer further transfer the second left audio channel triggering signal and the second right audio channel triggering signal to the second filter so as to replace respectively the first left audio channel triggering signal and the first right audio channel triggering signal; a signal generator, coupled to the two dimensional quantizer, is used to receive the second left audio channel triggering signal and the second right audio channel triggering signal and generate multiple driving signals according to the second triggering signals; and a logic circuit, comprising of multiple switches, wherein each switch is corresponded to one of the multiple driving signals and the logic circuit is coupled to the signal generator to receive the multiple driving signals and the corresponding switch in the logic circuit is controlled according to the multiple driving signals in order to drive the tri-wired stereo amplifier.

2. The class D amplifier claimed in claim 1, wherein the logic circuit is a three phase full bridge circuit.

3. The class D amplifier claimed in claim 2, wherein the three phase full bridge circuit contains six switches and the signal generator generates six driving signals to drive respectively the six switches.

4. The class D amplifier claimed in claim 1, wherein the second left audio channel triggering signal and the second right audio channel triggering signal are all selected from a set formed by five values of 0, 1, −1, ½ and −½.

5. The class D amplifier claimed in claim 4, wherein the second left audio channel triggering signal and the second right audio channel triggering signal are all selected from a set formed by three values of 0, 1 and −1.

6. The class D amplifier claimed in claim 1, wherein the frequency weighting average matches the following equation:

$$\begin{cases} \begin{bmatrix} X_R(k+1) \\ X_L(k+1) \end{bmatrix} = A \begin{bmatrix} X_R(k) \\ X_L(k) \end{bmatrix} + B \begin{bmatrix} AS'_R(k) - T_{R1}(k) \\ AS'_L(k) - T_{L1}(k) \end{bmatrix} \\ \begin{bmatrix} E_R(k) \\ E_L(k) \end{bmatrix} = C \begin{bmatrix} X_R(k) \\ X_L(k) \end{bmatrix} + D \begin{bmatrix} AS'_R(k) - T_{R1}(k) \\ AS'_L(k) - T_{L1}(k) \end{bmatrix} \end{cases};$$

wherein, $$\begin{bmatrix} X_R \\ X_L \end{bmatrix} \in R^{n \times 1}$$

is the state of the CLASS D AMPLIFIER; $A \in R^{n \times n}$; $B \in R^{n \times 2}$; $C \in R^{2 \times n}$; and $D \in R^{2 \times 2}$.

7. The class D amplifier claimed in claim 1, wherein the optimal signals ($O_L$, $O_R$) can make the value of the following equation the smallest: $V = E(k) P E(k)^T$; wherein, P is 2×2 weighting matrix having a form of $$\begin{bmatrix} 1 & p_1 \\ p_1 & 1 \end{bmatrix},$$

and p1<1; T is the period of P1 the over-sampling frequency.

8. A method for driving tri-wired stereo amplifier, comprising of the following steps: (a) Receiving a first left audio channel sound signal and a first right audio channel sound signal; (b) Associating with an over-sampling frequency to process the first left audio channel sound signal to a second left audio channel sound signal and to process the first right audio channel sound signal to a second right audio channel sound signal; (c) Re-configuring the second audio channel sound signal, a first left audio channel triggering signal and a first right audio channel triggering signal according to frequency weighting function so as to generate a left audio channel error signal corresponded to the second left audio channel sound signal and the first left audio channel triggering signal and a right audio channel error signal corresponded to the second right audio channel sound signal and the first right audio channel triggering signal; (d) Calculating, according to the error signals, a left audio channel optimal signal corresponded to the left audio channel error signal and a right audio channel optimal signal corresponded to the right audio channel error signal; (e) Converting the optimal signals into a second left audio channel triggering signal corresponded to the left audio channel optimal signal and a second right audio channel triggering signal corresponded to the right audio channel optimal signal; (f) Using respectively the second left audio channel triggering signal and the second right audio channel triggering signal to replace the first left audio channel triggering signal and the first right audio channel triggering signal; (g) Generating multiple driving signals according to the second triggering signal; and (h) Controlling the corresponding multiple switches of logic circuit according to the multiple driving signals so as to drive the tri-wired stereo amplifier.

9. The method claimed in claim 8, wherein the logic circuit is a three phase full bridge circuit.

10. The method claimed in claim 9, wherein the three phase full bridge circuit contains six switches and the signal generator generates six driving signals to control respectively the six switches.

11. The method claimed in claim 8, wherein the second left audio channel triggering signal and the second right audio channel triggering signal are all selected from one of the value in the set formed by the five values of 0, 1, −1, ½ and −½.

12. The method claimed in claim 11, wherein the second left audio channel triggering signal and the second right audio channel triggering signal are all selected from one of the value in the set formed by the three values of 0, 1 and −1.

13. The method claimed in claim 8, wherein the frequency weighting function matches the following equation:

$$\begin{cases} \begin{bmatrix} X_R(k+1) \\ X_L(k+1) \end{bmatrix} = A \begin{bmatrix} X_R(k) \\ X_L(k) \end{bmatrix} + B \begin{bmatrix} AS'_R(k) - T_{R1}(k) \\ AS'_L(k) - T_{L1}(k) \end{bmatrix} \\ \begin{bmatrix} E_R(k) \\ E_L(k) \end{bmatrix} = C \begin{bmatrix} X_R(k) \\ X_L(k) \end{bmatrix} + D \begin{bmatrix} AS'_R(k) - T_{R1}(k) \\ AS'_L(k) - T_{L1}(k) \end{bmatrix} \end{cases};$$

Wherein, $$\begin{bmatrix} X_R \\ X_L \end{bmatrix} \in R^{n \times 1}$$

is the state of CLASS D AMPLIFIER; $A \in R^{n \times n}$; $B \in R^{n \times 2}$; $C \in R^{2 \times n}$; and $D \in R^{2 \times 2}$.

14. The method claimed in claim 8, wherein those optimal signals ($O_L$, $O_R$) can make the value of the following equation the smallest:

$$V = E(k) P E(k)^T;$$

wherein, P is a 2×2 weighting matrix having the form of $$\begin{bmatrix} 1 & p_1 \\ p_1 & 1 \end{bmatrix}$$

and p1<1; T is the period of over-sampling frequency.

* * * * *